(12) United States Patent
Imai et al.

(10) Patent No.: US 7,286,637 B2
(45) Date of Patent: Oct. 23, 2007

(54) OPTICAL THIN FILM AND MIRROR USING THE SAME

(75) Inventors: Kyoko Imai, Utsunomiya (JP); Kenji Ando, Utsunomiya (JP); Hidehiro Kanazawa, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 57 days.

(21) Appl. No.: 10/546,517

(22) PCT Filed: Sep. 7, 2004

(86) PCT No.: PCT/JP2004/013292

§ 371 (c)(1),
(2), (4) Date: Aug. 23, 2005

(87) PCT Pub. No.: WO2005/024848

PCT Pub. Date: Mar. 17, 2005

(65) Prior Publication Data

US 2006/0221474 A1    Oct. 5, 2006

(30) Foreign Application Priority Data

Sep. 8, 2003   (JP) ............................. 2003-315438

(51) Int. Cl.
*G21K 1/06*    (2006.01)
(52) U.S. Cl. ...................................... 378/84
(58) Field of Classification Search ............... 378/114, 378/145, 204, 210, 44–50, 82–85; 313/113–114, 313/371; 359/196–7, 208, 212, 883
See application file for complete search history.

(56) References Cited

U.S. PATENT DOCUMENTS 5,144,409 A * 9/1992 Ma .............................. 257/557
5,221,411 A * 6/1993 Narayan ........................ 117/44
5,442,191 A * 8/1995 Ma .................................. 257/1
5,784,423 A * 7/1998 Lidsky et al. ................ 376/156

(Continued)

FOREIGN PATENT DOCUMENTS

JP    5-119208    5/1993

(Continued)

OTHER PUBLICATIONS

Ruf, Dr. Tobias, Single-isotope Silicon Helps Chips Keep Their Cool, May 10, 2000, Max Planck Society, pp. 1-3.*

(Continued)

*Primary Examiner*—Edward J. Glick
*Assistant Examiner*—Anastasia S. Midkiff
(74) *Attorney, Agent, or Firm*—Fitzpatrick, Cella, Harper & Scinto

(57) ABSTRACT

To provide an optical thin film structure capable of efficiently dissipating heat in an optical thin film which is generated upon irradiating a surface of an X-ray mirror made up of the optical thin film with an X-ray. The optical thin film having an isotope purity higher than a natural isotope abundance ratio is formed on a mirror to increase heat conductivity of the optical thin film itself and quickly dissipate heat accumulated in the thin film to the outside of an optical system. Consequently, the mirror having high reflectively can be obtained, in which a fine structure of the optical thin film is by no means broken.

4 Claims, 1 Drawing Sheet

U.S. PATENT DOCUMENTS

| | | | |
|---|---|---|---|
| 5,825,844 A * | 10/1998 | Miyake et al. | 378/34 |
| 5,911,858 A * | 6/1999 | Ruffner | 204/192.27 |
| 5,917,195 A * | 6/1999 | Brown | 257/22 |
| 5,945,204 A * | 8/1999 | Kumagai et al. | 428/212 |
| 5,982,546 A * | 11/1999 | Kawamoto et al. | 359/584 |
| 6,146,601 A * | 11/2000 | Abesadze et al. | 423/89 |
| 6,226,349 B1 * | 5/2001 | Schuster et al. | 378/84 |
| 6,377,655 B1 * | 4/2002 | Murakami et al. | 378/84 |
| 6,385,290 B1 * | 5/2002 | Kondo et al. | 378/84 |
| 6,433,474 B1 * | 8/2002 | Horiuchi et al. | 313/499 |
| 6,569,534 B2 * | 5/2003 | Yamaguchi et al. | 428/446 |
| 6,653,658 B2 * | 11/2003 | Burden | 257/76 |
| 6,867,459 B2 * | 3/2005 | Burden | 257/347 |
| 7,119,400 B2 * | 10/2006 | Burden | 257/347 |
| 2001/0033421 A1 * | 10/2001 | Murakami et al. | 359/584 |
| 2002/0001363 A1 * | 1/2002 | Kondo | 378/84 |
| 2002/0050160 A1 * | 5/2002 | Kelson et al. | 73/1.01 |
| 2003/0043483 A1 | 3/2003 | Folta et al. | 359/883 |
| 2003/0142785 A1 * | 7/2003 | Kageyama | 378/70 |
| 2003/0162104 A1 * | 8/2003 | Shoki | 430/5 |
| 2003/0183159 A1 * | 10/2003 | Nakagawa et al. | 117/84 |
| 2003/0222225 A1 * | 12/2003 | Shiraishi | 250/492.2 |
| 2004/0175633 A1 * | 9/2004 | Shoki et al. | 430/5 |
| 2005/0031071 A1 * | 2/2005 | Kanazawa et al. | 378/34 |
| 2005/0039670 A1 * | 2/2005 | Hosono et al. | 117/2 |
| 2005/0087699 A1 * | 4/2005 | Miyake | 250/492.1 |

FOREIGN PATENT DOCUMENTS

| | | |
|---|---|---|
| JP | 5-333199 | 12/1993 |
| JP | 7-65761 | 3/1995 |
| JP | 11-297624 | 10/1999 |
| JP | 3101695 B2 | 8/2000 |

OTHER PUBLICATIONS

Capinski, W.S., et al., Thermal Conductivity of Isotopically Enriched Si, Oct. 13, 1997, Applied Physics Letters, American Institute of Physics, vol. 71, Issue 15, pp. 2109-2111.*

A.I. Chumakov et al., "Resonant Diffraction of Synchrotron Radiation by a Nuclear Multilayer," 71(15) *Phys. Rev. Lett.* 2489-92 (1993).

Eugene E. Haller, "Isotopically Controlled Semiconductors," 39(4) *J. Nuclear Sci. Tech.* 382-85 (Apr. 2002).

L. Deák et al., "Pure Nuclear Bragg Reflection of a Periodic $^{56}$Fe/$^{57}$Fe Multilayer," 85(1) *J. Appl. Phys.* 1-7 (Jan. 1999).

N.D. Telling et al., "Interdiffusion in Direct Ion Beam Deposited Isotopic Fe/Si Trilayers," 89(11) *J. Appl. Phys.* 7074-76 (Jun. 2001).

* cited by examiner

OPTICAL THIN FILM AND MIRROR USING THE SAME

TECHNICAL FIELD

The present invention relates to an optical thin film and a mirror using the same. In particular, the invention relates to a multilayer film mirror used in a soft X-ray region.

BACKGROUND ART

In a soft X-ray region, light is significantly absorbed in all substances and in addition, a refractive index approximates 1. Hence, it is impossible in principle to make use of a lens operation due to its refraction. To that end, an optical system is made up of a mirror. In such a case, any general reflector made of a single-layer film has a direct incidence reflectivity of almost 0 and thus is far from functioning in the optical system. In contrast, a multilayer film made of a material relatively low in light absorption can function as a direct incidence mirror optical element, making it possible to use a reflective optical system realized by the utilization of effects thereof.

Heretofore, a reflector has been developed in order to obtain the aforementioned optical element such as a mirror, the reflector being made of a multilayer film including ultra-thin films formed by alternately stacking two kinds of substances, that is, A and B, up to at least several ten layers and defining a number of reflective surfaces as interfaces therebetween, with a thickness of the wavelength order that is determined based on an optical interference theory that phases of reflection waves from the respective interfaces match with each other. In order to obtain a high reflectivity, it is necessary to choose a proper combination of two substances, that is, the two substances A and B each having as small absorption coefficient as possible and having reflective indexes $n_A$ and $n_B$, respectively with a large difference therebetween. As a substance pair that enables the highest reflectivity within an incident wavelength range of 11 nm to 14 nm in a soft X-ray region, an alternate multilayer film made of Mo and Si is exemplified (see Japanese Patent No. 3101695, for example). The multilayer film is formed by a thin film formation technique such as magnetron sputtering, EB evaporation, or ion beam sputtering.

When the multilayer film made of Mo and Si is formed with the above technique, a central portion and peripheral portion of a film that is being formed are different in temperature, leading to a temperature variation. This causes a difference in how diffusion proceeds in the multilayer film, leading to an uneven film.

Further, a soft X-ray mirror made up of the multilayer film only reflects an X-ray having such a wavelength as to meet a reflection condition from among incident soft-X rays and absorbs almost all the X-rays having other wavelengths than the above wavelength. In short, if an intense soft X-ray enters the multilayer film mirror, an energy of the X-ray absorbed in the multilayer film heats the multilayer film. The temperature rise of the multilayer film is supposed to reach about several hundreds of 0° C. in the case of synchrotron radiation, although depending on an intensity of a soft X-ray incident on a reflector or an absorptivity for the X-ray of the multilayer film. Therefore, when the multilayer film is heated, its fine structure is broken and changed.

In general, when a considerably uneven multilayer film is used or the fine structure of the multilayer film is broken, the reflectivity thereof drops. To prevent such a situation that heat is locally accumulated in the multilayer film or its structure is broken, the heat should be dissipated from the inside of the multilayer film through heat transfer. A soft X-ray mirror made up of such a multilayer film is set in a vacuum when used as a component of an exposure device. In a vacuum, the heat transfer due to gases does not occur unlike the use in the air. Hence, the heat of the heated multilayer film needs to be transferred to a substrate through the multilayer film.

To that end, there has been proposed a method of forming a multilayer film mirror that easily induces heat transfer. With conventional techniques, heat is dissipated from a multilayer film by providing a cooling mechanism for cooling the multilayer film (see Japanese Patent Application Laid-Open No. 05-119208, for example). Also, the following method has been developed. That is, a substance of a high heat conductivity (heat transfer layer) is provided in contact with a multilayer film and heat is dissipated from the multilayer film (see Japanese Patent Application Laid-Open No. 05-333199, for example).

However, in the aforementioned conventional methods of dissipating heat from the multilayer film, heat radiation property of the multilayer film itself is not taken into account. Unless the heat conductivity of the multilayer film itself increases, the heat is not released from the multilayer film.

DISCLOSURE OF THE INVENTION

The present invention has an object to provide an optical thin film whose heat resistance is improved by increasing a heat conductivity of a multilayer film itself to dissipate and release heat in the multilayer film and an X-ray mirror using the same.

In order to attain the above-mentioned object, according to a first aspect of the present invention, there is provided an optical thin film which has a composition with an isotope purity higher than a natural isotope abundance ratio.

According to a second aspect of the present invention, there is provided an optical thin film, including at least a pair of alternate layers different in composition, in which at least one of the alternate layers is the optical thin film according to the first aspect of the invention.

According to a third aspect of the present invention, there is provided an optical element, including the optical thin film according to the first or second aspect of the invention.

According to a fourth aspect of the present invention, there is provided an X-ray mirror, including the optical thin film according to the second aspect of the invention.

According to a fifth aspect of the present invention, there is provided an X-ray mirror, including the optical thin film according to the second aspect of the invention, in which one of the alternate layers contains Mo and the other layer contains Si.

According to the present invention, it is possible that the optical thin film has the composition with the isotope purity higher than the natural isotope abundance ratio to thereby increase a heat conductivity of an optical film and heat accumulated inside the optical film is transferred and released to the outside of the film to thereby enhance the heat resistance of the optical film.

Also, in a soft X-ray multilayer film mirror made up of the above optical film, a fine structure of the multilayer film is not broken even through X-ray irradiation and maintains a high reflectivity.

BEST MODE FOR CARRYING OUT THE INVENTION

Hereinafter, specific description will be given of examples of the present invention with reference to the accompanying drawings.

(Example 1)

Figure 1:
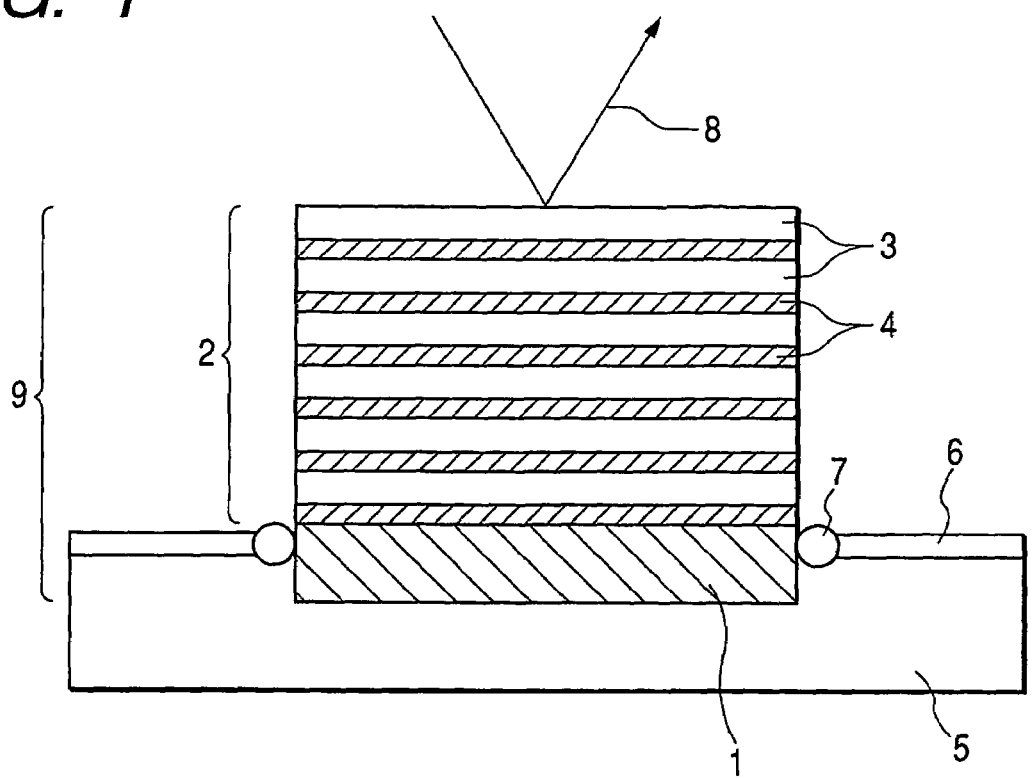
FIG. 1 is a schematic sectional view of a soft X-ray mirror according to an embodiment of the present invention.

FIG. 1 is a schematic sectional view of a soft X-ray multilayer film mirror according to the present invention.

A soft X-ray multilayer film mirror 9 is made up of a multilayer film 2 obtained by alternately stacking an Si layer 3 and an Mo layer 4 on a substrate 1 by magnetron sputtering. A holder 6 holding the multilayer film mirror 2 allows a cooling medium 5 such as water to flow therein. Also, the mirror has an O ring 7 that prevents the cooling medium 5 from leaking to the outside of the holder 6. With this arrangement, it is possible to cool the multilayer film 2 that is apt to increase its temperature due to the incidence of a soft X-ray 8.

The substrate 1 is preferably made of a material of high heat conductivity, for example, Si, Ni, Cu, or Ag.

When the Si layer 3 was formed on a surface of the substrate 1, sputtering was performed using Si as a target with an isotope purity higher than that in a natural state.

Similarly to the above, when the Mo layer 4 was formed, sputtering was performed using Mo as a target with an isotope purity higher than that in a natural state.

In such a way, the Si layers 3 and the Mo layers 4 were alternately formed on the surface of the substrate 1.

Adopted as a method of obtaining a target having a high isotopic purity was a method of extracting target substances on an element mass (isotope mass) basis through centrifugation.

The formed Si layer 3 contained $^{28}$Si at an abundance of 99%. In this case, the heat conductivity of the Si layer 3 was about 0.32 cal/sec.cm.deg. This value significantly exceeded a natural heat conductivity of Si, that is, 0.20 cal/sec.cm.deg.

The reason why the heat conductivity of the Si layer 3 increased is discussed below.

That is, in a natural state, three different isotopes of Si coexist with mass numbers of 28, 29, and 30, respectively. The way to transmit vibrations varies among the different isotopes. Therefore, the heat conductivity falls to hinder the temperature from decreasing. If atoms with the same mass number could be exclusively gathered, atomic vibrations could be more efficiently transmitted. The isotope purity of $^{28}$Si whose abundance in a natural state is 92.23% is further increased to obtain $^{28}$Si in a single crystal form with the abundance of 99.92%, so that the heat conductivity is 60% higher than that of Si in a natural state.

In the case of Mo as well, its heat conductivity is enhanced by increasing the purity of a specific isotope. A layer containing $^{98}$Mo at an abundance of 90% was used as the Mo layer 4.

When the multilayer film thus prepared is formed on the mirror surface, heat in the multilayer film is dissipated through the substrate. With this method, the heat resistance of the Mo/Si multilayer film is improved to realize a soft X-ray multilayer film mirror with a high reflectivity, in which a fine structure of the multilayer film is by no means broken.

As a result of comparing film characteristics of any conventional multilayer film reflector and the multilayer film reflector according to the present invention after the irradiation with the same amount of soft X-rays for several hours to several tens of hours, the former experienced film breakage and its reflectivity decreased by 2 to 3%. In contrast, the latter had excellent durability and was, therefore, free of a reflectivity decrease.

(Example 2)

Next, a soft X-ray multilayer film mirror according to another embodiment of the present invention will be described.

The soft X-ray multilayer film mirror of this example was made up of the multilayer film 2 obtained by alternately stacking the Si layer 3 and the Mo layer 4 on the substrate 1 having a high heat conductivity by magnetron sputtering as in Example 1. The Mo layer 4 was a layer containing Mo with a natural isotopic abundance ratio and a heat conductivity of 0.34 cal/sec.cm.deg. On the other hand, the Si layer 3 contained $^{28}$Si at an abundance of 99% or more with a heat conductivity of about 0.32 cal/sec.cm.deg. This value approximates the heat conductivity of the Mo layer. As discussed above, a substantially uniform heat conductivity was attained throughout the multilayer film, so that the heat inside the multilayer film was able to be easily transferred to the substrate 1. Thus, the heat resistance of the Mo/Si multilayer film was improved to realize the soft X-ray multilayer film mirror with a high reflectivity, in which a fine structure of the multilayer film was by no means broken.

(Example 3)

Figure 2:
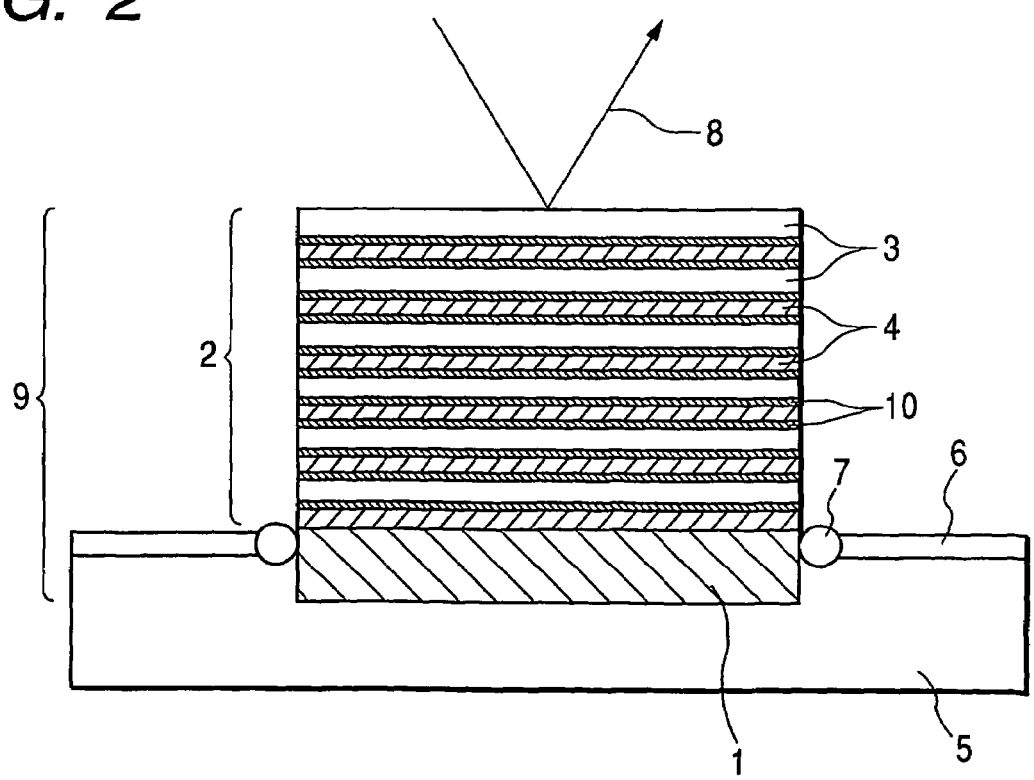
FIG. 2 is a schematic sectional view of a soft X-ray mirror according to another embodiment of the present invention.

Next, description will be given of a soft X-ray multilayer film mirror according to still another embodiment of the present invention, referring to FIG. 2.

The soft X-ray multilayer film mirror of this example was obtained by forming on the substrate 1 having a high heat conductivity, the Si layer 3 and the Mo layer 4, which sandwiched a $B_4C$ layer 10 that is an intermediate layer, by magnetron sputtering like Example 1. The multilayer film 2 of a four-layer structure obtained by forming the Si layer 3, the $B_4C$ layer 10, the Mo layer 4, and the $B_4C$ layer 10 in this order was regarded as a multilayer film in one cycle. The multilayer film 2 was formed by stacking the film of one cycle. According to this method, the Si layer 3 and the Mo layer 4 were unadjacent in the multilayer film, making it possible to prevent the production of interface compounds that would naturally occur between the Si layer 3 and the Mo layer 4.

An layer containing $^{28}$Si at an abundance of 99% or more and a layer containing $^{98}$Mo at an abundance of 90% were used as the Si layer 3 and the Mo layer 4, respectively. The heat conductivity thereof was enhanced by increasing the purity of a specific isotope. Further, in the $B_4C$ layer 10, the heat conductivity of the $B_4C$ layer 10 was 50% higher than that of $B_4C$ in a natural state by using $B_4C$ containing $^{11}$B at an abundance of 99% or more. Hence, the heat resistance of the Mo/$B_4$C/Si/$B_4$C multilayer film 2 was improved to realize a soft X-ray multilayer film mirror with a high reflectivity, in which a fine structure of the multilayer film was by no means broken.

This application claims priority from Japanese Patent Application No. 2003-315438 filed Sep. 8, 2003, which is hereby incorporated by reference herein.

The invention claimed is:

1. An optical element comprising a substrate and at least a pair of alternate layers provided on the substrate, the alternate layers each having an Mo layer and an Si layer, wherein the Mo layer contains 90% or more of $^{98}$Mo and the Si layer contains 99% or more of $^{23}$Si.

2. An optical element comprising a substrate and at least a pair of multilayer films of a four-layer structure provided on the substrate, each of the at least the pair of the multilayer films having an Si/B$_4$C/Mo/B$_4$C structure in this order from the substrate, wherein the Mo layer contains 90% or more of $^{98}$Mo, the Si layer contains 99% or more of $^{23}$Si and the B$_4$C layer contains 99% or more of $^{11}$B.

3. An X-ray mirror comprising the optical element according to claim 1.

4. An X-ray mirror comprising the optical element according to claim 2.

* * * * *